United States Patent
Kobayashi

(10) Patent No.: US 7,369,007 B2
(45) Date of Patent: May 6, 2008

(54) OSCILLATING CIRCUIT FOR SUPPRESSING SECOND HARMONIC WAVE

(75) Inventor: Hiroki Kobayashi, Fukushima-ken (JP)

(73) Assignee: Alps Electric Co., Ltd, Tokyo (JP)

( * ) Notice: Subject to any disclaimer, the term of this patent is extended or adjusted under 35 U.S.C. 154(b) by 136 days.

(21) Appl. No.: 11/374,758

(22) Filed: Mar. 14, 2006

(65) Prior Publication Data
US 2006/0208819 A1    Sep. 21, 2006

(30) Foreign Application Priority Data
Mar. 15, 2005  (JP)  ............... 2005-073693

(51) Int. Cl.
*H03B 5/08* (2006.01)
(52) U.S. Cl. .................. 331/167; 331/117 R
(58) Field of Classification Search .......... 331/76, 331/77, 117 R, 167
See application file for complete search history.

(56) References Cited

U.S. PATENT DOCUMENTS

| 5,576,667 | A | * | 11/1996 | Goma | ............... 331/117 D |
| 5,856,763 | A |   | 1/1999  | Reeser et al. | |
| 6,326,854 | B1 | * | 12/2001 | Nicholls et al. | ............... 331/56 |
| 6,456,169 | B2 |   | 9/2002  | Oshita et al. | |
| 2002/0158695 | A1 |   | 10/2002 | Lazarescu | |

FOREIGN PATENT DOCUMENTS

JP    08-148933    6/1996

* cited by examiner

*Primary Examiner*—Joseph Chang
(74) *Attorney, Agent, or Firm*—Brinks Hofer Gilson & Lione

(57) ABSTRACT

An oscillating circuit includes an oscillating transistor in which the collector or the base is grounded in a high-frequency manner, and a bias resistor connects the emitter of the oscillating transistor to a ground in a direct-current manner. In the oscillating circuit, a resonance unit, having maximum impedance at the oscillation frequency, is interposed between the bias resistor and the ground. Thus, an oscillation signal is obtained from the connection point between the bias resistor and the resonance unit.

2 Claims, 3 Drawing Sheets

OSCILLATING CIRCUIT FOR SUPPRESSING SECOND HARMONIC WAVE

BACKGROUND OF THE INVENTION

1. Field of the Invention

The present invention relates to an oscillating circuit obtaining an oscillation signal in which a second harmonic wave is suppressed.

2. Description of the Related Art

An oscillating circuit according to the related art includes a control terminal C, an output terminal P, a resonance circuit 1 whose resonance frequency varies depending on a control voltage VC that is to be applied to the control terminal C, an oscillation stage 2 whose oscillation frequency is determined on the basis of the resonance frequency of the resonance circuit 1, a buffer stage 3 which amplifies a signal output from the oscillator stage 2 and prevents variation of the oscillation frequency due to load variation, and an output matching stage 4 which matches a subsequent stage circuit to be connected to the output terminal P and suppresses harmonic waves, as shown in FIG. 5.

The resonance circuit 1 includes a coupling capacitor C1, a variable-capacitance diode VD, a resonance inductor L1, and a resonance capacitor C2. The control voltage VC applied to the control terminal C is applied to the variable-capacitance diode VD through a choke coil L2. The control terminal C is grounded in a high-frequency manner by means of a high-frequency bypass capacitor C3.

The oscillation stage 2 includes an oscillating transistor Q1, bias resistors R1 to R3, colpitts capacitors C4 and C5, a high-frequency bypass capacitor C6, a strip line SL connected in series with the bypass resistor R3, and a chip capacitor Cc connected in parallel to the strip line SL. The oscillation stage 2 is connected to the resonance circuit 1 through a coupling capacitor C7. Further, the bias resistor R3 regulates the DC bias of an emitter of the oscillating transistor Q1 serving as a current outputting terminal.

The buffer stage 3 includes a buffer transistor Q2 and bias resistors R4 and R5. The buffer stage 3 is connected to the oscillation stage 2 via a coupling capacitor C8. The output matching stage 4 includes a choke coil L3, a coupling capacitor C10, a high-frequency bypass capacitor C11, and an output terminal P. A driving power supply terminal B is grounded by a high-frequency bypass capacitor C12 (for example, refer to JP-A-08-148933).

The oscillating circuit according to the related art is configured so as to suppress harmonic waves by means of the output matching stage 4. However, when the levels of the harmonic waves included in the oscillation signal output from the emitter of the oscillating transistor Q1 are high, it is difficult to suppress the harmonic waves.

SUMMARY OF THE INVENTION

It is an object of the present invention to provide an oscillating circuit capable of effectively suppressing harmonic waves, in particular, a second harmonic wave having a high level when an oscillation signal is obtained.

An oscillating circuit according to a first aspect of the invention includes an oscillating transistor in which the collector or the base is grounded in a high-frequency manner, and a bias resistor that connects the emitter of the oscillating transistor to a ground in a direct-current manner. In the oscillating circuit, a resonance unit, having maximum impedance at an oscillation frequency, is interposed between the bias resistor and the ground, and an oscillation signal is obtained from the connection point between the bias resistor and the resonance unit.

In the oscillating circuit according to the first aspect, the resonance unit may include a parallel circuit having an inductance element and a capacitive element.

Further, in the oscillating circuit according to the first aspect, the resonance unit may include a parallel circuit having a first inductance element and a capacitive element, and a second inductance element connected in series with the parallel circuit.

Furthermore, in the oscillating circuit according to the first aspect, the resonance unit may include a series circuit having a first inductance element and a capacitive element, and a second inductance element connected in parallel to the series circuit.

Furthermore, in the oscillating circuit according to the first aspect, the resonance unit may include a microstrip line having one-fourth the length of a wavelength corresponding to the oscillation frequency.

The oscillating circuit according to the first aspect of the invention includes an oscillating transistor in which the collector or the base is grounded in a high-frequency manner, and a bias resistor that connects the emitter of the oscillating transistor to a ground in a direct-current manner. In the oscillating circuit, a resonance unit having maximum impedance at an oscillation frequency, is interposed between the bias resistor and the ground, and an oscillation signal is obtained from the connection point between the bias resistor and the resonance unit. Therefore, it is possible to obtain an oscillation signal in which harmonic waves are suppressed and to improve the C/N (carrier to noise ratio) of the oscillation signal.

In the oscillating circuit according to the first aspect, the resonance unit may include a parallel circuit having an inductance element and a capacitive element. Therefore, it is possible to obtain an oscillation signal in which harmonic waves are suppressed by a simple configuration and to improve the C/N of the oscillation signal.

Further, in the oscillating circuit according to the first aspect, the resonance unit may include a parallel circuit having a first inductance element and a capacitive element, and a second inductance element connected in series with the parallel circuit. Therefore, it is possible to obtain an oscillation signal in which a second harmonic wave is suppressed and to improve the C/N of the oscillation signal.

Furthermore, in the oscillating circuit according to the first aspect, the resonance unit may include a series circuit having a first inductance element and a capacitive element, and a second capacitive element connected parallel to the series circuit. Therefore, it is possible to obtain an oscillation signal in which a second harmonic wave is suppressed and to improve the C/N of the oscillation signal.

Furthermore, in the oscillating circuit according to the first aspect, the resonance unit may include a microstrip line having one-fourth the length of a wavelength corresponding to the oscillation frequency. Therefore, it is possible to obtain an oscillation signal in which a second harmonic wave is suppressed without using a dedicated circuit component and to improve the C/N of the oscillation signal.

DESCRIPTION OF THE PREFERRED EMBODIMENT

Oscillating circuits according to the invention will be described with reference to FIGS. 1 to 4. FIGS. 1 to 4 show oscillating circuits according to first to fourth embodiments together with buffer amplifiers, respectively.

Figure 1:
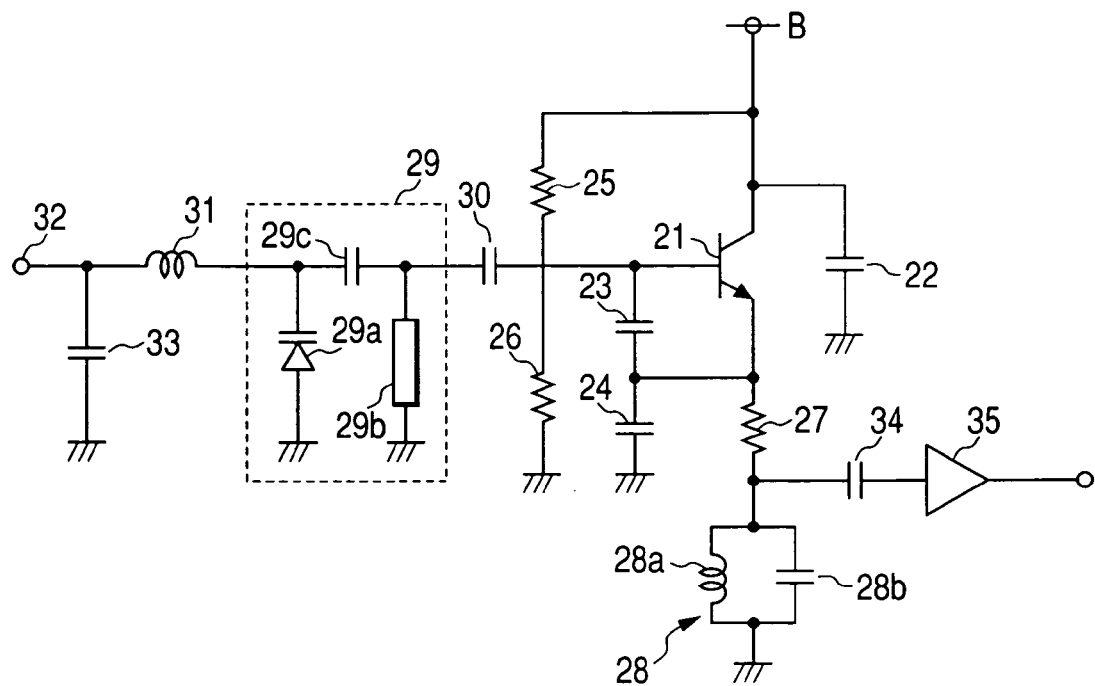
FIG. 1 is a circuit diagram showing the configuration of an oscillating circuit according to a first embodiment of the invention.

First, referring to FIG. 1, the collector of an oscillating transistor 21 is connected to a power supply B and is grounded by a bypass capacitor 22 in a high-frequency manner, a feedback capacitor 23 is connected between a base and an emitter, and a feedback capacitor 24 is connected between the emitter and the collector (ground). Further, a bias voltage is applied to the base from the connection point between two base bias resistors 25 and 26 connected in series with each other. One end of an emitter bias resistor 27 is connected to the emitter and the other end of the emitter bias resistor 27 is grounded through a resonance unit 28 having maximum impedance at the oscillation frequency. The resonance unit 28 includes a parallel circuit having an inductance element 28a and a capacitive element 28b. Accordingly, the resonance unit 28 forms a parallel resonance circuit which makes the parallel resonance frequency identical to the oscillation frequency.

A resonance circuit 29 is coupled between the base and the collector (ground) of the oscillating transistor 21. In particular, the resonance circuit 29 has a varactor diode 29a in which the anode is grounded and a strip line 29b whose one end is grounded. The cathode of the varactor diode 29a is coupled with the other end of the strip line 29b via a capacitor 29c. The other end of the strip line 29b is coupled with the base of the oscillating transistor 21 via a coupling capacitor 30.

The cathode of the varactor diode 29a is connected to a control terminal 32 by a choke inductor 31. The control terminal 32 is grounded by a bypass capacitor 33 in a high-frequency manner. Then, if a control voltage is applied to the cathode of the varactor diode 29a from the control terminal 32, the capacitance value of the varactor diode 29a is varied and thus, the oscillation frequency is also varied.

The oscillation signal is output from the connection point between the emitter bias resistor 27 and the resonance unit 28 and is then supplied to a buffer amplifier 35 through a coupling capacitor 34. On the output side of the buffer amplifier 35, for example, a circuit for suppressing the harmonic waves of the oscillation signal is connected.

In the above-mentioned configuration, the oscillation signal from the emitter of the oscillating transistor 21 is voltage-divided by the emitter bias resistor 27 and the resonance unit 28, and the impedance of the resonance unit 28 becomes maximal (ideally infinite) at the oscillation frequency. Therefore, the basic wave of the oscillation signal output from the connection point between the emitter bias resistor 27 and the resonance unit 28 does not attenuate sufficiently. However, since the impedance of the resonance unit 28 becomes lower as the frequency increases, it is possible to obtain an oscillation signal in which the harmonic waves are suppressed. Further, since the basic wave does not propagate through the emitter bias resistor 27, there is no loss at the emitter bias resistor, thus the C/N (carrier to noise ratio) of the oscillation signal becomes large.

Figure 2:
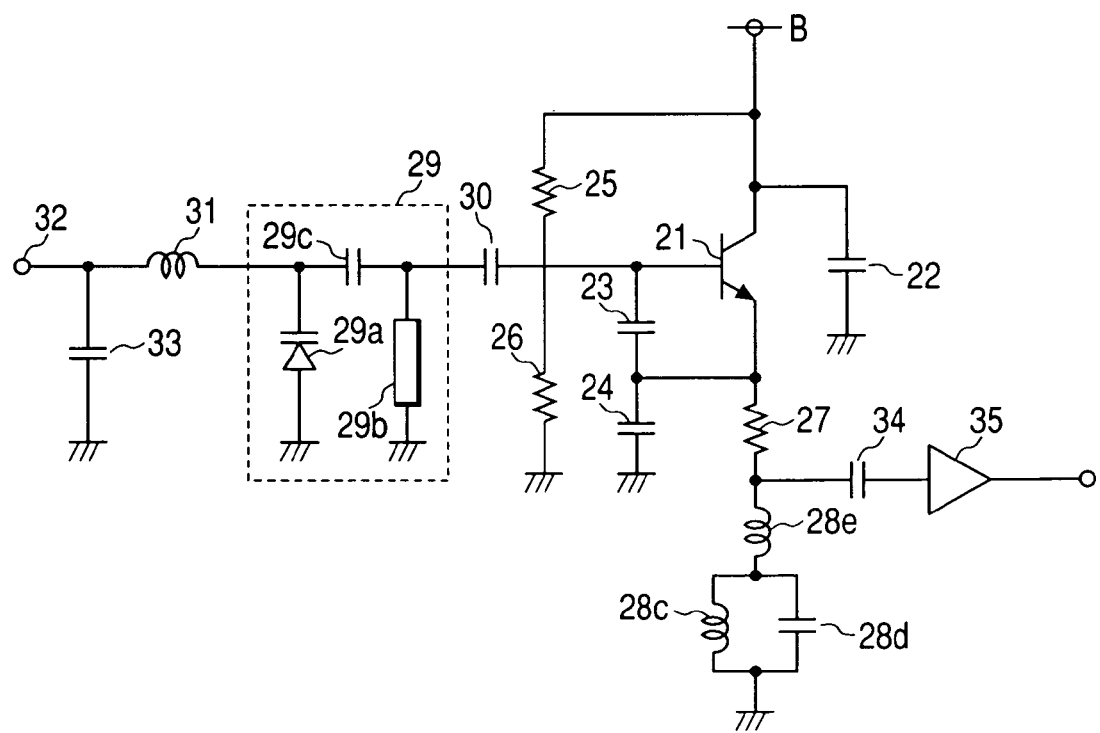
FIG. 2 is a circuit diagram showing the configuration of an oscillating circuit according to a second embodiment of the invention.

The resonance unit 28 shown in FIG. 2 includes a parallel circuit having a first inductance element 28c and a capacitive element 28d, and a second inductance element 28e connected in series with the parallel circuit. Therefore, the resonance unit 28 has a parallel resonance frequency and a series resonance frequency higher than the parallel resonance frequency. Then, the parallel resonance frequency is made to be identical to the oscillation frequency and the series resonance frequency is made to be identical to a harmonic wave (for example, second harmonic wave) frequency. Therefore, it is possible to obtain an oscillation signal in which the second harmonic wave is suppressed to the maximum extent possible.

Figure 3:
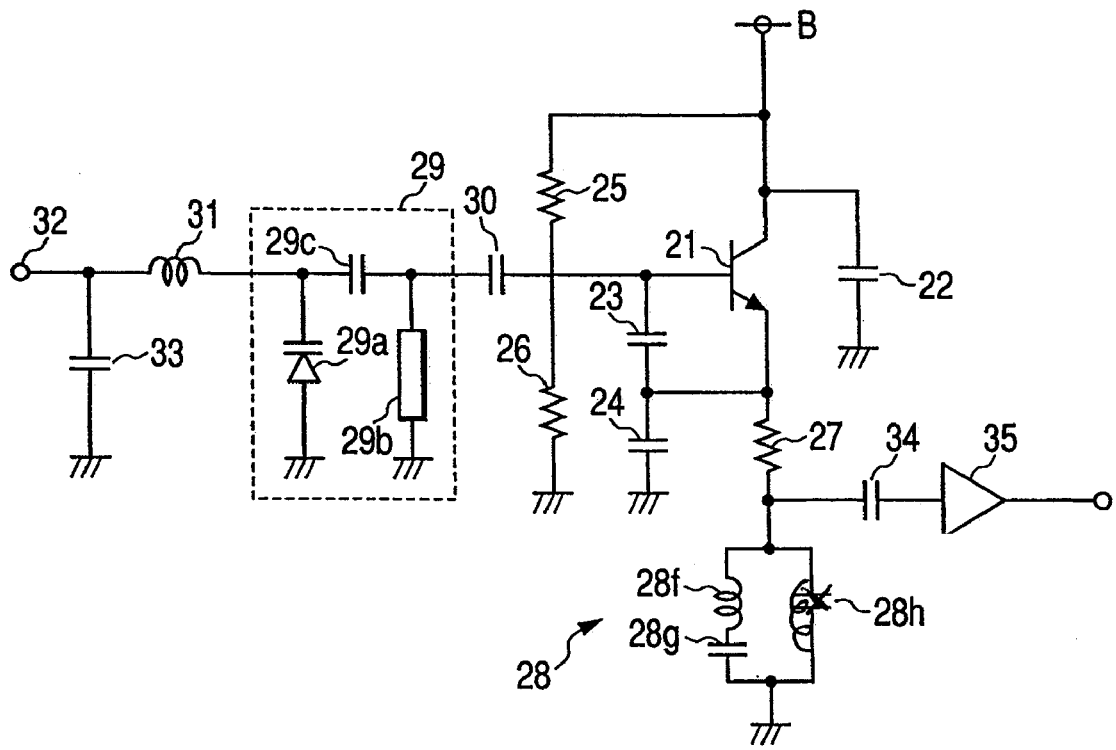
FIG. 3 is a circuit diagram showing the configuration of an oscillating circuit according to a third embodiment of the invention.

The resonance unit 28 shown in FIG. 3 includes a series circuit having a first inductance element 28f and a capacitive element 28g, and a second capacitive element 28h connected parallel to the series circuit. Therefore, the resonance unit 28 also has a parallel resonance frequency and a series resonance frequency higher than the parallel resonance frequency. Then, the parallel resonance frequency is made to be identical to the oscillation frequency and the series resonance frequency is made to be identical to a harmonic wave (for example, second harmonic wave) frequency. Therefore, it is possible to obtain an oscillation signal in which the second harmonic wave is suppressed to the maximum extent possible.

Figure 4:
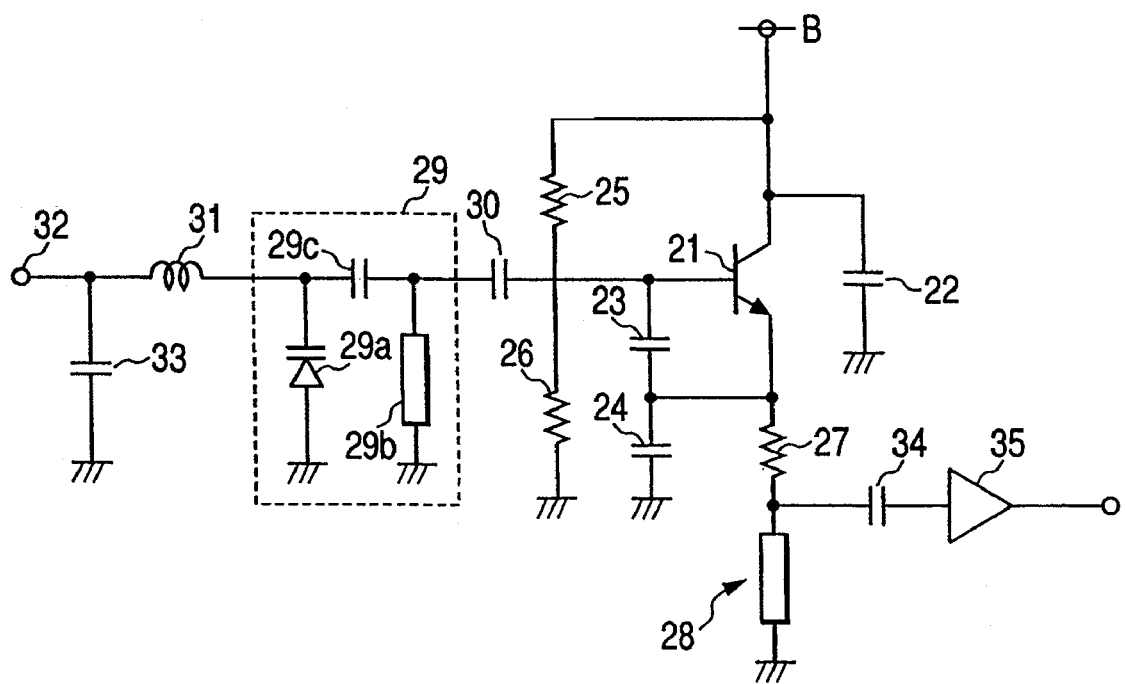
FIG. 4 is a circuit diagram showing the configuration of an oscillating circuit according to a fourth embodiment of the invention.
Figure 5:
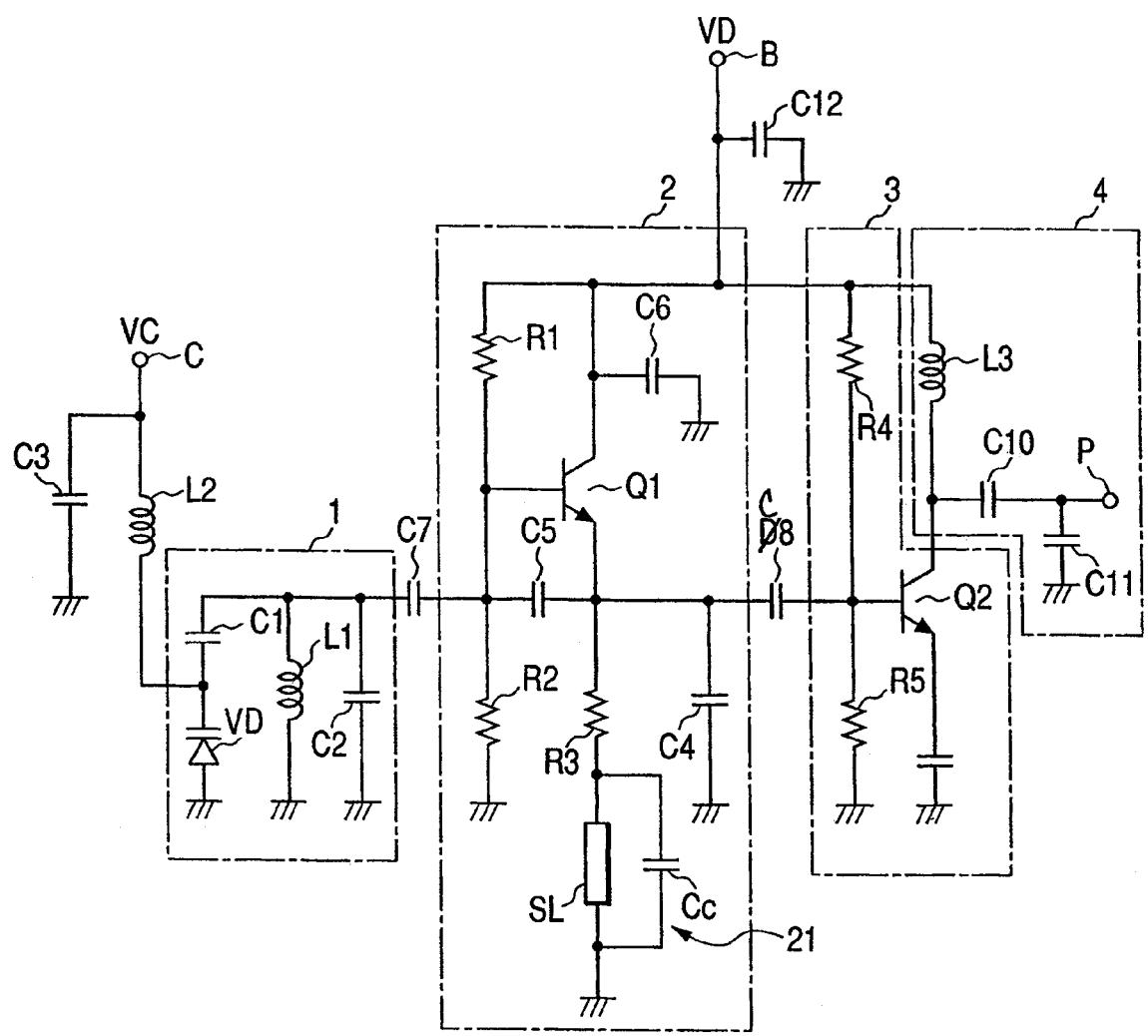
FIG. 5 is a circuit diagram showing the configuration of an oscillating circuit according to the related art.

The resonance unit 28 shown in FIG. 4 is configured by a microstrip line without using a dedicated circuit component. The length of the microstrip line is set to one-fourth the wavelength corresponding to the oscillation frequency. Accordingly, ideally, the impedance when the ground side is viewed from the connection point between the emitter bias resistor 27 and the microstrip line becomes infinite. Meanwhile, as for the second harmonic wave, since the length becomes a half of the wavelength corresponding to the oscillation frequency, the impedance is 0 (zero). Therefore, it is possible to attenuate the second harmonic wave without attenuating the basic wave of the oscillation signal.

In FIGS. 2 to 4, the other configuration except for the resonance unit 28 is same. Further, in FIGS. 1 to 4, the grounded-collector-type oscillating circuits have been described but it is apparent that the invention may be applied to a grounded-base-type.

The invention claimed is:

1. An oscillating circuit comprising:
   an oscillating transistor in which a collector or a base is ground in a high-frequency manner;
   a bias resistor that connects an emitter of the oscillating transistor to a ground in a direct-current manner;
   a resonance unit, having a maximum impedance at an oscillation frequency and a series resonance frequency made to be a second harmonic wave frequency, is interposed between the bias resistor and the ground; and
   an oscillation signal is obtained from the connection point between the bias resistor and the resonance unit,
   wherein the resonance unit includes a parallel circuit having a first inductance element and a capacitive element, and a second inductance element connected in series with the parallel circuit.

2. An oscillating circuit
an oscillating transistor in which a collector or a base is ground in a high-frequency manner;
a bias resistor that connects an emitter of the oscillating transistor to a ground in a direct-current manner;
a resonance unit, having a maximum impedance at an oscillation frequency and a series resonance frequency made to be a second harmonic wave frequency, is interposed between the bias resistor and the ground; and
an oscillation signal is obtained from the connection point between the bias resistor and the resonance unit,
wherein the resonance unit includes a series circuit having a first inductance element and a capacitive element, and a second inductance element connected parallel to the series circuit.

* * * * *